United States Patent
Hamm et al.

(10) Patent No.: US 7,955,977 B2
(45) Date of Patent: Jun. 7, 2011

(54) METHOD OF LIGHT INDUCED PLATING ON SEMICONDUCTORS

(75) Inventors: Gary Hamm, Billerica, MA (US); David L. Jacques, Northbridge, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 234 days.

(21) Appl. No.: 12/456,790

(22) Filed: Jun. 23, 2009

(65) Prior Publication Data

US 2010/0003817 A1    Jan. 7, 2010

Related U.S. Application Data

(60) Provisional application No. 61/133,765, filed on Jul. 2, 2008.

(51) Int. Cl.
*H01L 21/68* (2006.01)
(52) U.S. Cl. .......... 438/678; 438/674; 257/E21.586
(58) Field of Classification Search .......... 438/98, 438/652, 655, 666, 674, 678; 205/587, 594, 205/271; 257/E21.586
See application file for complete search history.

(56) References Cited

U.S. PATENT DOCUMENTS 4,451,969 A * 6/1984 Chaudhuri .......... 438/62
* cited by examiner

*Primary Examiner* — Thanhha Pham
(74) *Attorney, Agent, or Firm* — John J. Piskorski

(57) ABSTRACT

Methods of light induced plating of nickel onto semiconductors are disclosed. The methods involve applying light at an initial intensity for a limited amount of time followed by reducing the intensity of the light for the remainder of the plating period to deposit nickel on a semiconductor.

9 Claims, No Drawings

METHOD OF LIGHT INDUCED PLATING ON SEMICONDUCTORS

The present invention is directed to a method of light induced plating on semiconductors. More specifically, the present invention is directed to a method of light induced plating on semiconductors where light is initially applied at a high intensity for a limited period of time followed by reducing the light intensity for the remainder of a plating cycle.

Metal plating of semiconductors, such as photovoltaics and solar cells, involves the formation of electrically conductive contacts on front and back sides of the semiconductors. The metal coating must be able to establish ohmic contact with the semiconductor in order to ensure that charge carriers emerge from the semiconductor into the electrically conductive contacts without interference. In order to avoid current loss, metallized contact grids must have adequate current conductivities, i.e. a high conductivity or a sufficiently high conductor track cross section.

Numerous processes which meet the above requirements exist for metal coating the back sides of solar cells. For example, in order to improve current conduction at the back side of solar cells, p-doping directly under the back side is reinforced. Usually aluminum is used for this purpose. The aluminum is applied, for example, by vapor deposition or by being printed onto the back side and being driven in or, respectively, alloyed in. When metal coating the front sides, or light incidence sides, the objective is to achieve the least amount of shading of the active semiconductor surface in order to use as much of the surface as possible for capturing photons.

Metal coatings using thick-film techniques are conventional methods for metallizing conductor tracks. Pastes used include metal particles and are electrically conductive as a result. The pastes are applied by screen, mask, pad printing or paste writing. A commonly used process is the screen printing process where finger-shaped metal coating lines having a minimum line width of 80 µm to 100 µm are made. Even at this grid width electrical conductivity losses are evident in comparison with a pure metal structure. This can have an adverse effect on the series resistance and on the filling factor and efficiency of the solar cell. This effect is intensified at smaller printed-on conductor track widths because the process causes the conductor tracks to become flatter. Nonconductive oxide and glass components between the metal particles constitute a fundamental cause of this reduced conductivity.

More complex processes for producing the front side contacts make use of laser or photographic techniques for the definition of the conductor track structures. The conductor tracks are then metallized. In general, various metal coating steps are often used in order to apply the metal coating in attempting to achieve sufficient adhesive strength and a desired thickness for electrical conductivity. For example, when wet-chemical metal coating processes are used, a first fine metal coating is deposited on the current tracks by means of palladium catalyst. This is often reinforced with electroless deposition of nickel. In order to increase the conductivity, copper may be deposited on the nickel by electroless or electrolytic deposition. The copper may then be coated with a fine layer of tin or silver to protect it from oxidation.

Alternatively, current tracks may be metallized using a light induced plating process as disclosed in U.S. Pat. No. 5,543,333. The metallization process involves first metallizing the back side of the solar cell using conventional methods of printing and sintering an electrically conductive paste in an inert gas atmosphere. The current tracks of the front side are then plated with nickel by light induced plating. The solar cell is placed in a nickel plating bath and light is applied to the solar cell and a nickel layer is generated on a semiconductor substrate after approximately 1-2 minutes. A further metal layer may be directly generated over this nickel layer for reinforcement. A nickel layer having a thickness of 0.2 to 2 microns may be obtained after a deposition time of 1-3 minutes.

Although there are methods of depositing metals, such as nickel on semiconductors using light induced plating, workers in the field have discovered a number of problems associated with light induced plating on semiconductors. One problem is achieving uniform coverage when a relatively thin layer is desired, such as from 20 nm to 300 nm. Often the uniformity of nickel coverage is unacceptable in the industry at these low thickness values. Nickel plating initiates more quickly in some areas of the semiconductor than others, resulting in areas not having sufficient time to begin to plate within the very short cycle time needed to deposit the desired nickel thickness. By illuminating the semiconductor during electroless nickel plating, coverage is found to be more uniform than for identical parts plated without light. However, if the light is maintained at the intensity required to ensure uniform initiation, the resulting accelerated plating rate leads to a stressed nickel deposit and greatly increases the potential for loss of nickel adhesion to the semiconductor.

In one aspect a method includes providing a doped semiconductor which includes a front side, and a back side, the front side is n doped and includes an anti-reflective layer including patterned openings to expose part of the n doped front side of the semiconductor below the anti-reflective layer, the back side includes a metal coating; contacting the doped semiconductor with a nickel plating composition; and applying light to the doped semiconductor at an initial light intensity for a predetermined amount of time followed by reducing the initial intensity to a predetermined amount for the remainder of a plating cycle to deposit nickel onto the exposed part of the n doped front side of the doped semiconductor.

In another aspect after the nickel is deposited onto the exposed part of the n doped front side of the doped semiconductor, the doped semiconductor with the nickel deposit is sintered to form nickel silicide. Sintering is typically done in an inert gas atmosphere. After sintering nickel, which did not form the silicide is typically plated with one or more layers of another metal.

In a further aspect the nickel which did not form the nickel silicide may be stripped. The exposed nickel silicide may then be plated with another metal.

The method provides low thickness nickel deposits which are uniform and have acceptable adhesion to doped semiconductor substrates. The method enables patterning of smaller feature sizes on a substrate than with screen printed conductive paste technology. By reducing the feature sizes on the substrate, the number of features may be increased. This is very desirable when the semiconductor is used in a photovoltaic device, such as a solar cell. By reducing the width of current tracks on a front surface of a photovoltaic device, the number of the current tracks may be increased, thus the current tracks may be situated closely together resulting in improved solar cell efficiency. In addition the method provides substantially complete nickel coverage of the doped semiconductor reducing or eliminating voids in the nickel deposit in contrast to many conventional light induced plating processes. Substantially complete coverage is necessary to promote uniform nickel silicide formation and also to ensure adhesion of subsequent metal layers which may be plated over the sintered nickel deposit. Further, the method provides improved adhesion between the sintered nickel deposit and one or more additional metal layers deposited on the nickel silicide in contrast to many conventional light induced plating processes. Also, the light induced plating method provides more consistent nickel coverage with good adhesion over a wider range of substrates than many conventional light induced plating processes.

As used throughout this specification, the terms "depositing" and "plating" are used interchangeably. The terms "current tracks" and "current lines" are used interchangeably. The terms "composition" and "bath" are used interchangeably. The indefinite articles "a" and "an" are intended to include both the singular and the plural. The term "selectively depositing" means that metal deposition occurs in specific desired areas on a substrate. The term "lux=lx" is a unit of illumination equal to one lumen/m$^2$; and one lux=1.46 milliwatt of radiant electromagnetic (EM) power at a frequency of 540 tetrahertz. The following abbreviations have the following meanings unless the context clearly indicates otherwise: ° C.=degrees Celsius; g=grams; mL milliliter; L=liter; A=amperes; dm=decimeter; cm=centimeter; μm=micrometers; nm=nanometers; min.=minute; sec.=second; UV=ultra violet; IR=infrared; and SEM=scanning electron microscope. All percentages and ratios are by weight unless otherwise indicated. All ranges are inclusive and combinable in any order except where it is clear that such numerical ranges are constrained to add up to 100%.

Photovoltaics and solar cells may be composed of monocrystalline or polycrystalline or amorphous silicon semiconductor wafers. While the description below is with regard to silicon semiconductor wafers, other suitable semiconductor wafers, such as gallium-arsenide, silicon-germanium, and germanium, may also be used. When silicon wafers are used, they typically have a p-type base doping.

The semiconductor wafers may be circular, square or rectangular in shape or may be any other suitable shape. Such wafers may have a wide variety of dimensions and surface resistivities. For example, circular wafers may have a diameter of 150 nm, 200 nm, 300 nm, 400 nm, or greater.

The back side of a wafer is metallized to provide a low resistance wafer. Any conventional method may be used. Typically, the surface resistance, also known as sheet resistance, of the semiconductor wafer is 40 to 90 ohms/square, or such as from 40 oh ms/square to 60 ohms/square, or such as from 60 ohms/square to 80 ohms/square.

The entire back side may be metal coated or a portion of the back side may be metal coated, such as to form a grid. Such back side metallization may be provided by a variety of techniques, and may be done prior to the metallization of the front side of the wafer. In one embodiment, a metal coating is applied to the back side in the form of an electrically conductive paste, such as a silver-containing paste, an aluminum-containing paste or a silver and aluminum-containing paste; however, other pastes which include metals such as nickel, palladium, copper, zinc or tin also may be used. Such conductive pastes typically include conductive particles embedded in a glass matrix and an organic binder. Conductive pastes may be applied to the wafer by a variety of techniques, such as screen printing. After the paste is applied, it is fired to remove the organic binder. When a conductive paste containing aluminum is used, the aluminum partially diffuses into the back side of the wafer, or if used in a paste also containing silver, may alloy with the silver. Use of such aluminum-containing paste may improve the resistive contact and provide a "p+"-doped region. Heavily doped "p+"-type regions by previous application of aluminum or boron with subsequent interdiffusion may also be produced. In one embodiment, an aluminum-containing paste may be applied to the back side and fired before the application of the back side metal coating. The residue from the fired aluminum-containing paste may optionally be removed prior to the application of the back side metal coating. In an alternate embodiment, a seed layer may be deposited on the back side of the wafer and a metal coating may be deposited on the seed layer by electroless or electrolytic plating.

The front side of the wafer may optionally be subjected to crystal-oriented texture etching in order to impart to the surface an improved light incidence geometry which reduces reflections. To produce the semiconductor junction, phosphorus diffusion or ion implantation takes place on the front side of the wafer to produce an n-doped (n+ or n++) region and provides the wafer with a PN junction. The n-doped region may be referred to as the emitter layer.

An anti-reflective layer is added to the front side or emitter layer of the wafer. In addition the anti-reflective layer may serve as a passivation layer. Suitable anti-reflective layers include, without limitation, silicon oxide layers such as $SiO_x$, silicon nitride layers such as $Si_3N_4$, a combination of silicon oxide and silicon nitride layers, and combinations of a silicon oxide layer, a silicon nitride layer with a titanium oxide layer such as $TiO_x$. In the foregoing formulae, x is the number of oxygen atoms. Such anti-reflective layers may be deposited by a number of techniques, such as by various vapor deposition methods, for example, chemical vapor deposition and physical vapor deposition.

The front side of a wafer contains a metallized pattern. For example, the front side of a wafer may be composed of current collecting lines and current busbars. Current collecting lines are typically transverse to the busbars and typically have a relatively fine-structure (i.e. dimensions) relative to current busbars.

In one embodiment, the front side or emitter layer of the wafer is coated with an antireflective layer, such as silicon nitride. An opening or pattern is then defined on the front side. The pattern reaches through the antireflective layer to expose the surface of the semiconductor body of the wafer. Alternatively trenches may be formed in the openings which penetrate the surface of the wafer to a depth of 1 to 100 μm into the semiconductor body of the wafer. Deeper or shallower trench depths may be employed. A variety of processes may be used to form the pattern, such as, but not limited to, laser ablation, mechanical means, and lithographic processes, all of which are well known in the art. Such mechanical means include sawing and scratching. Typical photolithographic processes include disposing an imageable material on the surface of the wafer, patterning the imageable material to form openings in the anti-reflective layer, transferring the pattern to the wafer, depositing a metal layer in the openings and removing the imageable material. In one embodiment, the imageable material is removed before the step of depositing a nickel layer in the openings. In another embodiment, the imageable material is removed after the step of depositing a nickel layer in the openings. When the imageable material is present during the nickel deposition step, such imageable material typically avoids any dyes, such as contrast dyes, that absorb in the wavelength of radiation used during the nickel deposition step. Imageable material present during the plating step typically contains a dye which has a minimum light transmittance of 40-60%.

When the imageable material is a liquid, such material may be disposed on the surface of the wafer by any suitable technique such as, but not limited to, by spin coating, inkjet printing, curtain coating, and roller coating. When the imageable material is a dry film, such material may be disposed on the surface of the wafer by vacuum lamination.

The imageable material is patterned by exposing the imageable material to actinic radiation through a mask. The choice of actinic radiation will depend upon the particular imageable material selected. Lasers as well as other conventional sources of actinic radiation may be used to pattern the imageable material.

The pattern in the imageable material is next transferred to the semiconductor wafer substrate. Pattern transfer may be performed using wet chemical etching techniques or by using dry etching techniques. Suitable dry etching techniques include, without limitation, plasma etching such as reactive ion etching. The pattern typically is composed of lines of relatively narrow cross-sectional dimension which are current collecting lines and lines of relatively thick cross-sectional dimension which are busbars. The busbars are transverse to the current collecting lines.

The imageable material may be removed using any suitable polymer remover, such as those sold by Rohm and Haas Electronic Materials (Marlborough, Mass.). Such removers may be alkaline, acidic or essentially neutral.

Irrespective of the technique used to form the pattern, such openings may optionally be contacted with acid (such as hydrofluoric acid) or alkali to texture or roughen the surfaces of the exposed semiconductor. Optionally, another diffusion process may be performed using an n-type dopant, resulting in "n++"-doping in the opened regions.

A layer of nickel is then deposited on the front side conductive pattern by light induced nickel deposition. If the source of the nickel is an electroless nickel composition, plating is done without application of external current. If the source of the nickel is from an electrolytic nickel composition, a rear side potential (rectifier) is applied to the semiconductor wafer substrate. The light may be continuous or pulsed. The semiconductor is immersed in the nickel plating composition and light is applied to the semiconductor at an initial intensity for a predetermined amount of time followed by reducing the initial light intensity to a predetermined amount for the remainder of the plating cycle to deposit a nickel layer onto the exposed part of the n doped front side of the doped semiconductor. The light intensity applied to the semiconductor substrate following the initial light intensity and applied for the remainder of the plating cycle is always less than the initial intensity. The absolute values of the initial light intensity and the reduced light intensity following the initial period vary and they may be varied during the plating process to achieve optimum plating results as long as the initial light intensity is higher than the light intensity for the remainder of the plating cycle. If the initial light intensity varies during the initial time period, the light intensity applied for the remainder of the plating cycle may be based on the average of the initial light intensity. Minor experimentation may be performed to determine a suitable initial light intensity, a suitable initial time period for applying the initial light intensity, and a light intensity applied for the remainder of the plating cycle. If the initial light intensity is maintained for too long, poor nickel deposit adhesion and flaking may occur due to a relatively high nickel deposit stress. If the light is extinguished, undesirable nickel plating may occur on the back side of the wafer.

In general, the initial time period for applying the initial light intensity is greater than 0 seconds to 15 seconds. Typically, the initial light intensity is applied to the semiconductor for 0.25 seconds to 15 seconds, more typically 2 seconds to 15 seconds, most typically for 5 seconds to 10 seconds.

In general, the reduced light intensity is 5% to 50% of the initial light intensity. Typically, the reduced light intensity is from 20% to 50%, or such as from 30% to 40% of the initial light intensity.

Light which may be used to initiate the plating process includes, but is not limited to, visible light, infrared, UV and X-rays. Light sources include, but are not limited to, incandescent lamps, LED lights (light emitting diodes), infrared lamps, fluorescent lamps, halogen lamps and lasers. In general the amount of light initially applied to the semiconductor may be 8000 lx to 20,000 lx, or such as from 10000 lx to 15,000 lx. In general the amount of light applied to the semiconductor wafer for the remainder of the plating cycle may be from 400 lx to 10,000 lx, or such as from 500 lx to 7500 lx.

Typically, nickel is deposited through the openings in the anti-reflective layer and onto the exposed surface of the semiconductor wafer using an electroless nickel plating composition. The electroless nickel plating composition may or may not include a reducing agent. Typically, the electroless nickel plating composition does include a reducing agent. Examples of commercially available electroless nickel compositions include Duraposit™ SMT 88 and NiPosit™ PM 980 and PM 988. All are available from Rohm and Haas Electronic Materials, LLC, Marlborough, Mass., U.S.A.

Alternatively, electrolytic nickel compositions may be used; however, typically an applied rear side potential (rectifier) is used in addition to light to deposit the nickel. Typical current densities are from 0.1 A/dm$^2$ to 2 A/dm$^2$, and more typically from 0.5 A/dm$^2$ to 1.5 A/dm$^2$. The particular current requirement is dependent upon the particular size of the wafer used. The electroplating processes used are conventional. Suitable electrolytic nickel plating baths are commercially available as well as many which are disclosed in the literature. Examples of commercially available electrolytic nickel baths are the Nickel Gleam™ series of electrolytic products obtainable from Rohm and Haas Electronic Materials, LLC. Other examples of suitable electrolytic nickel plating baths are the Watts-type baths disclosed in U.S. Pat. No. 3,041,255.

In general, the patterned semiconductor wafer is submerged in a nickel plating composition contained in a plating cell. A light source is positioned to illuminate the semiconductor wafer with light energy. If the patterned semiconductor wafer is a silicon solar cell, the light source can be, for example, a fluorescent or LED lamp which provides energy within the wavelengths to which the silicon solar cell is photovoltaically sensitive. A variety of other light sources may be used, such as, but not limited to, incandescent lamps such as a 75 watt and 250 watt lamp, mercury lamps, halogen lamps and a 150 watt infrared lamp. The light energy can be either continuous or pulsed. Pulsed illumination can be achieved, for example, by interrupting the light with a mechanical chopper or an electronic device may be used to cycle power to the lights intermittently based on a desired cycle.

The plating cell is of such a material as to be chemically inert with respect to the nickel plating composition and has a minimum light transmittance of 40-60%. Alternatively, the wafer can be positioned horizontally in the plating cell and illuminated from above the nickel plating composition, in which case the plating cell need not have at least the minimum light transmittance.

By illuminating the front of the semiconductor wafer with light energy plating occurs on the front. The impinging light energy generates a current in the solar cell. The rate of plating on the front is controllable by adjusting the light intensity, bath temperature, reducing agent activity, starting wafer conditions, doping level as well as other parameters which are known to workers in the art. A nickel layer of 20 nm to 300 nm thickness, or such as from 50 nm to 150 nm is typically desired for a solar cell, with the exact thickness depending on various factors such as on the application, cell size, pattern and geometry.

The nickel ions in the plating compositions may be provided by using any suitable solution-soluble nickel compound, typically a nickel salt. Such nickel compounds include, but are not limited to, nickel sulfate, nickel chloride, nickel sulfamate, and nickel phosphate. Mixtures of nickel compounds may be used in the plating compositions. Such mixtures may be metal compounds having the same metal but being different compounds, such as a mixture of nickel sulfate and nickel chloride. The nickel compounds are added to the plating compositions in an amount sufficient to provide a nickel ion concentration in the plating composition of 0.1 to 150 g/L, typically from 0.5 to 100 g/L, and more typically from 1 to 70 g/L.

The nickel compounds are added to the plating compositions in an amount sufficient to provide a nickel ion concentration in the plating composition of 0.1 to 150 g/L, more typically from 0.5 to 100 g/L, and still more typically from 1 to 70 g/L.

Typically, electroless nickel compositions are used; however, when the nickel plating compositions are electroplating compositions an electrolyte is included. Any of a wide variety of electrolytes may be used in the nickel plating compositions, including acids and bases. Exemplary electrolytes include, without limitation, alkane sulfonic acids such as methane sulfonic acid, ethane sulfonic acid and propane sulfonic acid; alkylol sulfonic acids; aryl sulfonic acids such as toluene sulfonic acid, phenyl sulfonic acid and phenol sulfonic acid; amino-containing sulfonic acids such as amido sulfonic acid; sulfamic acid; mineral acids; carboxylic acids such as formic acid and haloacetic acids; hydrogen halide acids; and pyrophosphate. Salts of acids and bases also may be used as the electrolyte. Further, the electrolyte may contain a mixture of acids, a mixture of bases or a mixture of one or more acids with one or more bases. Such electrolytes are generally commercially available from a variety of sources, such as Aldrich chemical company.

Optionally a wide variety of surfactants may be used in the nickel plating compositions. Any of anionic, cationic, amphoteric and nonionic surfactants may be used as long as it does not interfere with the performance of the nickel plating. Surfactants may be included in conventional amounts.

Optionally, the plating compositions may contain one or more additional components. Such additional components include, without limitation, brighteners, grain refiners and ductility enhancers. Such additional components are well known in the art and are used in conventional amounts.

When the nickel plating composition is an electroless nickel composition, reducing agents may be included. A wide variety of reducing agents are known in the art for such nickel plating compositions. Such reducing agents include, but are not limited to sodium hypophosphite, sodium hypophosphite, potassium hypophosphite, thiourea and thiourea derivatives, hydantoin and hydantoin derivatives, hydroquinone and hydroquinone derivatives, resorcinol, and formaldehyde and formaldehyde derivatives, DEA (n-diethyl-amine borane), sodium borohydride and hydrazine. Such reducing agents may be used in conventional amounts such as from 0.1 g/L to 40 g/L.

The nickel plating composition may optionally contain a buffering agent. Exemplary buffering agents include, but are not limited to, borate buffer (such as borax), phosphate buffer, citrate buffer, carbonate buffer, and hydroxide buffer. The amount of the buffer used is that amount sufficient to maintain the pH of the plating composition at a desired level, such amount being well known to those skilled in the art.

Nickel plating compositions may have a pH in the range of 1 to 14, typically from 1 to 12, more typically from 1-8. The working temperature of the nickel plating compositions during plating may be from 10 to 100° C., or such as from 20 to 50° C.

After the nickel is deposited through the openings and onto the exposed surface of the semiconductor wafer substrate, the wafer is sintered to form a layer of nickel silicide. Typically not all of the nickel deposit reacts with the semiconductor material during sintering to form the nickel silicide. Accordingly, a nickel layer remains on top of and adjacent to the nickel silicide. The nickel silicide is between the nickel layer and adjacent the semiconductor material. Sintering is done in a lamp based furnace (IR) which achieves a wafer peak temperature of 400° C. to 600° C. The higher the sintering temperature applied the shorter the sintering cycle or time period in which the semiconductor remains in the oven. If the semiconductor remains too long in the oven at a given temperature, nickel may diffuse too deeply into the wafer penetrating the emitter layer thus shunting the cell. Such sintering processes are well known in the art and some minor experimentation may be required to achieve an optimum sintering cycle.

After the nickel silicide is formed on the exposed semiconductor, one or more additional metal layers may be deposited on the unreacted nickel of the nickel layer adjacent the nickel silicide to complete metallization of the pattern and form current tracks. Such additional metal layers may be copper or silver. If the additional metal is copper, a tin strike layer may be deposited onto the copper to prevent oxidation. Such additional metal layers may be deposited by electroless, immersion, electrolytic, light induced metal plating using conventional plating baths and processes. Typically, such metal layers range from 1 μm to 50 μm, more typically, from 5 μm to 25 μm. Strike coatings of tin may range from 0.25 μm to 2 μm. If the additional metal layer is deposited electrolytically, typical current densities are from 0.1 A/dm$^2$ to 3 A/dm$^2$, and more typically from 1 A/dm$^2$ to 3 A/dm$^2$. The total current requirement is dependent upon the particular size of the wafer used.

Optionally, after the nickel silicide is formed the unreacted nickel may be stripped from the nickel silicide using an inorganic acid such as nitric acid. After the unreacted nickel is stripped additional metal layers may be deposited on the nickel silicide by the same methods as are used to deposit metal on the unreacted nickel. In addition to copper and silver, a layer of nickel may be deposited on the nickel silicide. Also, if copper is deposited on the nickel silicide a tin strike layer may be plated on the copper to inhibit oxidation of the copper.

Sources of such metals for the additional metal layers may include, without limitation: metal halides; metal nitrate; metal carboxylates such as acetate, metal formate and metal gluconate; metal-amino acid complexes such as metal-cysteine complexes; metal alkyl sulfonates such as metal methane sulfonate and metal ethane sulfonate; metal alkylol sulfonates, metal tolyl sulfonates, and metal phenol sulfonates; and metal cyanides. When the metal is silver, the metal salt is typically not a silver halide due to the limited solubility of such salts. Examples of copper compounds include, but are not limited to, copper pyrophosphate, copper gluconate, copper sulfate and copper chloride. Examples of tin compounds include, but are not limited to, tin chloride, tin sulfate and tin methane sulfonate. Mixtures of metal compounds may be used. Such mixtures may be metal compounds having the same metal but being different compounds, such as a mixture of silver nitrate and silver-cysteine complex.

The metal compounds are added to plating baths in an amount sufficient to provide a metal ion concentration in the plating composition of 0.1 to 150 g/L. When the metal ions are silver ions, the concentration of silver ions in the bath is typically in an amount of 2 to 40 g/L. Such metal compounds are generally commercially available from a variety of sources, such as Aldrich chemical company, Milwaukee, Wis. Examples of a commercially available copper electroplating baths are Copper Gleam™ ST 901 and 901A available from Rohm and Haas Electronic Materials, LLC, Marlborough, Mass. An example of a commercially useful silver plating bath is available as ENLIGHT™ silver plate 620 from Rohm and Haas Electronic Materials, LLC Marlborough, Mass.

A wide variety of conventional surfactants may be used in the metal plating baths. Any of anionic, cationic, amphoteric and nonionic surfactants may be used. Surfactants may be included in conventional amounts.

The metal plating baths may contain one or more additional conventional components. Such additional components include, without limitation, electrolytes, buffers, brighteners, grain refiners, chelating agents, complexing agents, reducing agents, levelers and ductility enhancers. Such additional components are well known in the art and are used in conventional amounts.

The method provides low thickness nickel deposits which exhibit uniform coverage and acceptable adhesion to the doped semiconductor substrate. The method enables patterning of smaller feature sizes on a substrate than with screen printed conductive paste technology. By reducing the feature sizes on the substrate, the number of features may be increased. This is very desirable when the semiconductor is used in a photovoltaic device, such as a solar cell. By reducing the width of current tracks on a front surface of a photovoltaic device, the number of the current tracks may be increased, thus the current tracks may be situated closely together resulting in improved solar cell efficiency. In addition the method provides substantially complete nickel coverage of the doped semiconductor reducing or eliminating voids in the nickel deposit in contrast to many conventional light induced plating processes. Substantially complete coverage eliminates or at least reduces the potential for unacceptable adhesion of subsequent plated layers in areas where there is no underlying nickel deposit. Further, the method provides improved adhesion between the sintered nickel deposit and one or more additional metal layers in contrast to many conventional light induced plating processes. Also, the light induced plating method provides more consistent performance over a wider range of substrates than many conventional light induced plating processes.

The light induced nickel plating method has been described with particular reference to silicon wafers used in solar cells; however, photovoltaic devices fabricated from materials other than silicon may also be used, with appropriate changes where necessary, for example, in the source of light energy employed.

The following examples are included to illustrate various aspects of the invention but are not intended to limit the scope of the invention.

EXAMPLES 1-9

Comparative

Eight doped monocrystalline silicon wafers and one doped multicrystalline silicon wafer having pyramidal elevations on their front side were provided. Each doped silicon wafer had an n+ doped zone on the front side of the wafer forming an emitter layer. Each wafer had a pn-junction below the emitter layer. The front side of each wafer was coated with a passivation or antireflective layer composed of $Si_3N_4$. The front side of each wafer had a pattern for current tracks through the antireflective layer which exposed the surface of the silicon wafers. Each current track traversed the entire length of the wafer. The current tracks joined a bus bar at an end of each wafer and at the center of each wafer. The back side of each wafer was p+ doped and contained an aluminum electrode.

Each doped monocrystalline silicon wafer was immersed into a high temperature aqueous electroless nickel plating composition (Duraposit™ SMT 88) contained in a chemically inert plating cell which was not transparent to light. Plating temperatures ranged from 75° C. to 85° C. The doped multicrystalline wafer was immersed into a low temperature aqueous electroless nickel plating composition (NiPosit™ PM 988) contained in a chemically inert plating cell which was not transparent to light. Plating temperatures ranged from 35° C. to 45° C. No light from an artificial light source was applied to the plating cells during nickel deposition; however; ambient light was measured at less than 200 lx. The ambient light was measured using a conventional Fisher Scientific light meter. Nickel was deposited by conventional electroless deposition. Table 1 below discloses plating times and nickel deposit coverage on each of the wafers.

TABLE 1

| EXAM-PLE | WAFER TYPE | PLATING TIME (Sec.) | NICKEL THICK-NESS (nm) | PLATING RESULTS |
|---|---|---|---|---|
| 1 | Monocrystalline | 30 | | Incomplete coverage |
| 2 | Monocrystalline | 90 | | Incomplete coverage |
| 3 | Monocrystalline | 90 | 62 | Incomplete coverage |
| 4 | Monocrystalline | 150 | | Incomplete coverage |
| 5 | Monocrystalline | 30 | | Incomplete coverage |
| 6 | Monocrystalline | 90 | | Incomplete coverage |
| 7 | Monocrystalline | 60 | 71 | Incomplete coverage |
| 8 | Monocrystalline | 150 | | Incomplete coverage |
| 9 | Multicrystalline | 30 | | Incomplete coverage, poor uniformity |

After each wafer was nickel plated they were examined for the nickel coverage on the current tracks using a conventional scanning electron microscope. The thickness of the nickel deposit was measured using the SEM on the wafers of Examples 3 and 7 to be certain that the plating on the wafers was being done in the right thickness range. The SEM images disclosed rough and discontinuous surfaces on the pyramidal structures of the current tracks on all of the wafers plated. This indicated incomplete nickel coverage.

EXAMPLES 10-16

Comparative

The method disclosed in Examples 1-9 above was repeated using six doped monocrystalline semiconductor wafers and one doped multicrystalline wafer. The monocrystalline wafers of Examples 10-13 were nickel plated using the same type of electroless nickel compositions as in Example 1-9. The multicrystalline wafer of Example 14 and the monocrystalline wafers of Examples 15 and 16 were nickel plated using NiPosit™ PM 988 at a temperature of 35° C. to 45° C. Artificial light was applied to the wafers through out the plating cycle. The light source was a 250 watt halogen lamp.

Each wafer was immersed in one of the electroless nickel compositions which were contained in chemically inert plating cells. The plating cells were transparent to light energy. Light was applied to each wafer and the intensity of the light at eight points on the wafer was measured to determine the average light intensity on each wafer during nickel deposition. The eight points were the same on each wafer. Three of the points were located 1-2 cm from a first edge of each wafer. The center point of the three was equidistant from the other two points. Three other points were located 1-2 cm from the edge opposite the edge of the first three set of points. The center point of the second set of three points was equidistant from the other two points. The last two points were located equidistant from imaginary perpendicular planes of each of the two sets of three points near the edges of each wafer. Both points were equidistant from the center of each wafer. The light at each of the points for each wafer was measured using a conventional Fisher Scientific light meter. The average intensity applied across each wafer was determined to be 13786 lx. The average intensity of the light was not increased or reduced during nickel plating but was maintained at 13786 lx. Table 2 below discloses the plating times, nickel deposit thickness and nickel deposit condition after plating.

TABLE 2

| EXAM-PLE | WAFER TYPE | PLATING TIME (SEC.) | NICKEL THICK-NESS (NM) | PLATING RESULTS |
|---|---|---|---|---|
| 10 | Monocrystalline | 30 | 340 | Stressed nickel deposit, poor adhesion |
| 11 | Monocrystalline | 120 | 1480 | Stressed nickel deposit, poor adhesion |
| 12 | Monocrystalline | 30 | 470 | Stressed nickel deposit, poor adhesion |
| 13 | Monocrystalline | 120 | 860 | Stressed nickel deposit, poor adhesion |
| 14 | Multicrystalline | 60 | 134 | Nearly complete nickel coverage but nickel flaking |
| 15 | Monocrystalline | 120 | 420 | Stressed deposit with significant cracking |
| 16 | Monocrystalline | 120 | 330 | Stressed deposit with significant cracking |

After plating each wafer was examined for quality of nickel deposit. Each wafer was examined using a SEM. All of the wafers of Examples 10-13 showed separation of nickel from the pyramid structures of the current tracks. Examples 15 and 16 showed significant nickel deposit cracking. These defects were believed to be caused by an excessive nickel plating rate which resulted in increased deposit stress. Although the nickel deposit on the multicrystalline wafer showed nearly complete initial coverage, nickel flaking was apparent with areas of exposed silicon substrate where nickel had flaked from or in some cases nickel began to plate again in the areas of initial flaking.

EXAMPLES 17-24

Four monocrystalline wafers and four multicrystalline wafers were doped as described in Examples 1-9. Each wafer was immersed in an electroless nickel composition which was contained in a chemically inert plating cell. The plating cells were transparent to light. The monocrystalline wafers of Example 17-18 were plated with nickel using Duraposit™ SMT 88. The remainder of the wafers was nickel plated with NiPosit™ PM 988. Artificial light was applied throughout nickel deposition. The light source was a 250 watt halogen lamp as used in Example 2. The average light intensity for the wafers was determined as disclosed in Examples 10-16. The initial light intensity for all of the Examples was determined to be 13786 lx. After a predetermined amount of time, the initial light intensity was reduced to a predetermined amount (a percentage) of the initial light intensity for the remainder of the plating cycle. Table 3 below discloses the plating times, light intensity, nickel deposit thickness and plating results of the wafers.

TABLE 3

| EXAMPLE | WAFER TYPE | INITIAL TIME (SEC) | % OF INITIAL LIGHT INTENSITY | REMAINDER OF PLATING CYCLE (SEC) | DEPOSIT THICKNESS (NM) | RESULTS |
|---|---|---|---|---|---|---|
| 17 | Monocrystalline 1 | 5 | 5 | 15 | | Nearly complete coverage, good adhesion |
| 18 | Monocrystalline 1 | 10 | 5 | 10 | 70 | Uniform coverage, good adhesion |
| 19 | Multicrystalline 3 | 10 | 20 | 150 | 101 | Complete coverage, good adhesion |
| 20 | Multicrystalline 3 | 10 | 20 | 70 | 70 | Good coverage, no flaking or blistering of deposit |

TABLE 3-continued

| EXAMPLE | WAFER TYPE | INITIAL TIME (SEC) | % OF INITIAL LIGHT INTENSITY | REMAINDER OF PLATING CYCLE (SEC) | DEPOSIT THICKNESS (NM) | RESULTS |
|---|---|---|---|---|---|---|
| 21 | Multicrystalline 3 | 3 | 20 | 150 | 105 | Good coverage, no flaking of blistering of deposit |
| 22 | Multicrystalline 4 | 5 | 5 | 25 | | Good coverage |
| 23 | Monocrystalline 5 | 10 | 20 | 230 | 213 | Complete coverage, good adhesion |
| 24 | Monocrystalline 5 | 10 | 20 | 20 | 113 | Complete coverage, good adhesion |

Each wafer was removed from their respective plating cells and examined for nickel deposit coverage on the current tracks using an electron microscope. The SEMs showed good nickel coverage on all of the wafers. All of the nickel deposits appeared uniform and smooth. In addition, Examples 17-19 and 23-24 showed good adhesion of the nickel to the wafers. Examples 20 and 21 showed good nickel deposit coverage, not nickel flaking or blistering. No cracking of the nickel deposit was noticed on any of the wafers.

In contrast, all of the nickel deposits of Examples 1-9 where no artificial light was applied showed defects. Nickel coverage was incomplete in all of the plated wafers. In Examples 10-16 where artificial light was applied through out the entire plating cycle without any reduction in light intensity, all of the plated wafers had defects. Poor adhesion of the nickel layer, flaking of the nickel and cracking of the nickel deposit were observed. Accordingly, the method of applying light at an initial intensity for a predetermined amount of time followed by reducing the intensity to a predetermined amount for the remainder of the plating cycle provides improved nickel deposits on semiconductor wafers.

What is claimed is:

1. A method comprising:
   a) providing a doped semiconductor comprising a front side, and a back side, the front side is n doped and comprises a anti-reflective layer comprising patterned openings to expose a part of the n doped front side of the semiconductor below the anti-reflective layer, the back side comprises a metal coating;
   b) contacting the doped semiconductor with a nickel plating composition; and
   c) applying light to the doped semiconductor at an initial light intensity for a predetermined amount of time followed by reducing the initial light intensity to a predetermined amount for the remainder of a plating cycle to deposit a nickel layer onto the exposed part of the n doped front side of the doped semiconductor.

2. The method of claim 1, further comprising a step of sintering the nickel layer to form nickel on nickel silicide.

3. The method of claim 2, further comprising a step of depositing one or more metal layers on the nickel on the nickel silicide.

4. The method of claim 2, further comprising a step of stripping the nickel from the nickel silicide.

5. The method of claim 4, further comprising a step of depositing one or more metal layers on the nickel silicide.

6. The method of claim 1, wherein the initial light intensity is reduced to 5% to 50% of the initial light intensity for the remainder of the plating cycle.

7. The method of claim 1, wherein the predetermined amount of time of the initial light intensity is greater than 0 seconds to 15 seconds.

8. The method of claim 1, wherein a thickness of the nickel layer is 20 nm to 300 nm.

9. The method of claim 1, wherein the doped semiconductor is for a solar cell or photovoltaic device.

* * * * *